United States Patent [19]

Sugawara

[11] Patent Number: 5,130,675
[45] Date of Patent: Jul. 14, 1992

[54] VOLTAGE-CONTROLLED OSCILLATOR

[75] Inventor: Hideo Sugawara, Ohtawara, Japan

[73] Assignee: Fujitsu Limited, Kawasaki, Japan

[21] Appl. No.: 754,826

[22] Filed: Sep. 4, 1991

[30] Foreign Application Priority Data

Sep. 10, 1990 [JP] Japan .................. 2-239625

[51] Int. Cl.⁵ .................. H03B 5/18; H03L 7/099
[52] U.S. Cl. .................. 331/117 D; 331/36 C; 331/99; 331/117 FE; 331/177 V
[58] Field of Search .................. 331/36 C, 96, 99, 100, 331/101, 102, 107 DP, 107 SL, 117 R, 117 FE, 117 D, 177 V

[56] References Cited

U.S. PATENT DOCUMENTS 4,630,004 12/1986 Niehenke et al. .......... 331/117 D X

FOREIGN PATENT DOCUMENTS 2595518 9/1987 France .

OTHER PUBLICATIONS

"The GAAS FET Oscillator—Its Signal and Noise Performance", Institute of Electrical and Electronics Engineers Proceedings of the 40th Annula Frequency Symposium, 1986.
"An Ultra-Low Noise Microwave Synthesizer", IEEE Transactions on Microwave Theory and Techniques, vol. 27, No. 12, Dec. 1979.
Patent Abstracts of Japan, vol. 014, No. 461 (E-987) Oct. 5, 1990.

*Primary Examiner*—David Mis
*Attorney, Agent, or Firm*—Armstrong & Kubovcik

[57] ABSTRACT

A voltage-controlled oscillator according to the present invention comprises: a transistor, where the drain electrode is grounded, the gate electrode is connected to a resonator whose resonant frequency is adjustable according to a voltage applied to a voltage-dependent capacitance diode electromagnetically coupled with the resonator, an output signal is output from the source electrode; a resistor connected in gate bias circuit or source voltage supply circuit for detecting a low-frequency noise component generated in the transistor, where the detected low-frequency noise component is amplified and fed back to the voltage-dependent capacitance diode so as to cancel a phase-noise component generated in the voltage-controlled oscillator. The above-described voltage-controlled oscillator may be further provided with a reference crystal oscillator to which the voltage-controlled oscillator is phase-locked. Thus, a microwave voltage-controlled oscillator excellent in phase-noise characteristics of the oscillated frequency is accomplished though there is employed a GaAs FET which is not good in a low-frequency noise characteristic.

5 Claims, 3 Drawing Sheets

VOLTAGE-CONTROLLED OSCILLATOR

BACKGROUND OF THE INVENTION

1. Field of the Invention

This invention relates to a voltage-controlled oscillator employed, for example, in a multichannel microwave transmission apparatus.

2. Description of the Related Arts

As a voltage-controlled oscillator, a silicon bipolar transistor generating less low-frequency-noise has been employed in a lower-frequency band, for example, below 12 GHz, and a gallium-arsenide field effect transistor (referred to hereinafter as a GaAs FET) has been preferably employed in a higher-frequency band due to its high maximum frequency of oscillation though its low-frequency noise characteristics is not preferable. The low-frequency noise of the transistor vitally affects a phase-noise characteristics of the oscillated frequency. Accordingly, the phase-noise characteristics of the microwave oscillator employing a GaAs FET is generally worse than that of silicon transistor.

A typical circuit diagram of a prior art microwave voltage-controlled oscillator employing a GaAs FET and its noise characteristics are shown in FIG. 1 and FIG. 2, respectively. Drain electrode D of a GaAs FET 14 is grounded, its gate electrode G is connected to a transmission line 13 whose opposite end is grounded via a DC (direct current) stopping capacitor $C_1$ and a terminating resistor $R_1$. An oscillation frequency signal $f_{out}$ is output from its source electrode S via a DC stopping capacitor $C_2$. Transmission line 13 is electromagnetically coupled with a dielectric resonator 12 having a resonant frequency $f_o$. Dielectric resonator 12 is further coupled with an open stub 11 whose one end is open and another end is connected to a variable-capacitance diode $D_1$ to which a reverse bias is applied via a choke coil $CH_1$. choke coils $CH_2$ and $CH_3$ supply a bias voltage to gate electrode G, and a source voltage to source electrode S, respectively. Open stub 11 and variable-capacitance diode $D_1$ form a sub-resonator circuit and modulates, i.e. modifies, the resonant frequency $f_o$ of dielectric resonator 12 by the capacitance change according to the reverse voltage applied to the diode $D_1$. Thus, this oscillator operates as a voltage-controlled oscillator providing a frequency change of, for example, ±30 MHz for 12 GHz centre frequency.

GaAs FET 14 having worse low-frequency noise characteristics compared with that of a silicon transistor generates phase noise components denoted with A on the sidebands, namely ±1 MHz, of the output frequency, 12 GHz, as shown as frequency spectrum in FIG. 2. Therefore, it has been seriously requested to provide a microwave voltage-controlled oscillator excellent in its phase-noise characteristics employing a transistor which is not good in a low-frequency noise characteristic.

SUMMARY OF THE INVENTION

It is a general object of the invention to provide a microwave voltage-controlled oscillator excellent in phase-noise characteristics of the oscillated frequency though employing a transistor not good in a low-frequency noise characteristic.

A voltage-controlled oscillator according to the present invention comprises: a transistor, where a drain electrode is grounded, a gate electrode is connected to a resonator whose resonant frequency is adjustable according to a voltage applied to a voltage-dependent capacitance diode electromagnetically coupled with the resonator, an output signal is output from a source electrode; a resistor serially connected in gate bias circuit or drain voltage supply circuit for detecting a low-frequency noise component generated in the transistor. The detected low-frequency noise component is amplified and fed back to the voltage-dependent capacitance diode so as to cancel a phase-noise component generated in the voltage-controlled oscillator. The above-described voltage-controlled oscillator may be further provided with a reference crystal oscillator to which the voltage-controlled oscillator is phase-locked.

The above-mentioned features and advantages of the present invention, together with other objects and advantages, which will become apparent, will be more fully described hereinafter, with references being made to the accompanying drawings which form a part hereof, wherein like numerals refer to like parts throughout.

A BRIEF DESCRIPTION OF THE DRAWINGS

DESCRIPTION OF THE PREFERRED EMBODIMENT

Figure 1:
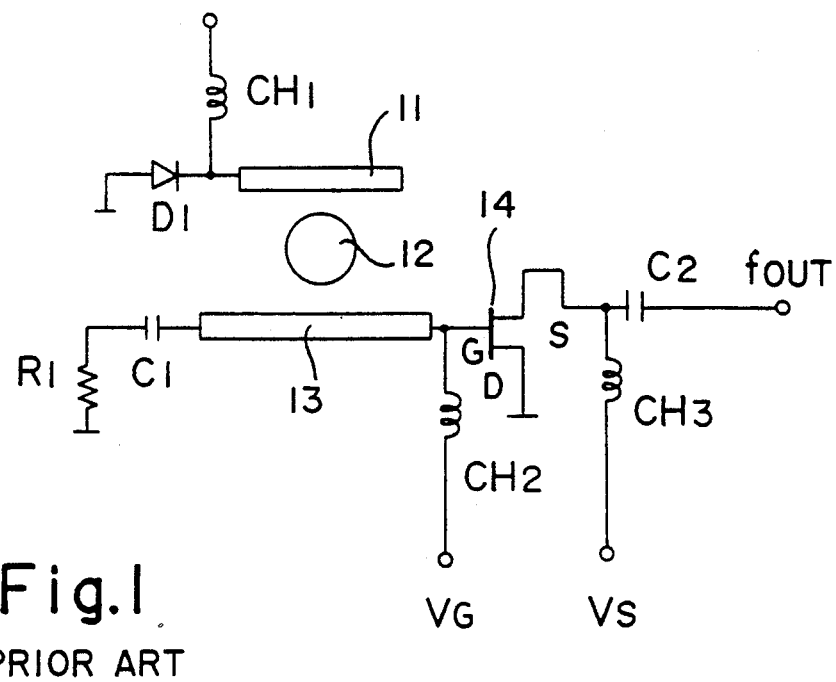
FIG. 1 shows a typical circuit configuration of a prior art microwave voltage-controlled oscillator.
Figure 2:
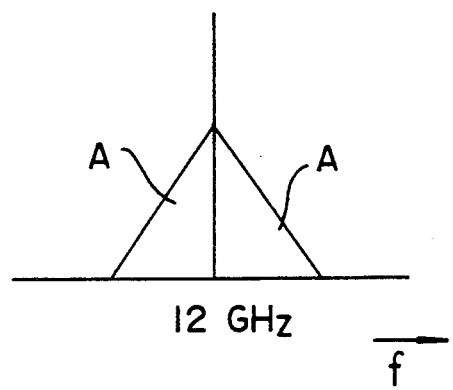
FIG. 2 shows phase-noise spectrum in an output of the FIG. 1 prior art oscillator.

Referring to circuit diagrams of preferred embodiments, the present invention is hereinafter described in detail. In a first preferred embodiment of the present invention shown in FIG. 3, a GaAs FET 5 is provided such that: drain electrode D is grounded, gate electrode G is connected to a transmission line 32 whose opposite end is grounded via a DC (direct current) stopping capacitor $C_1$ and a terminating resistor $R_1$ typically equivalent to the characteristic impedance of transmission line 32. An oscillation frequency signal frequency $f_{out}$ is output from its source electrode S via a DC stopping capacitor $C_2$. Transmission line 32 typically formed of a strip line is electromagnetically coupled with a dielectric resonator 3 having a resonant frequency $f_o$. dielectric resonator 3 is further coupled with an open stub 21 whose one end is open and another end is connected to a variable-capacitance diode $D_1$ to which a reverse bias $+V_v$ is applied via a resistor $R_{10}$ and choke coil $Ch_1$. choke coil $Ch_2$ supplies a bias voltage to gate electrode G, and choke coil $Ch_3$ supplies source voltage to source electrode S, while the coke coils prevent the microwave signal. Open stub 21 and variable-capacitance diode $D_1$ form a sub-resonator circuit and gives an effect on the resonant frequency $f_o$ of dielectric resonator 12 by the capacitance change according to the reverse voltage applied to the diode $D_1$. Thus, the oscillation frequency is slightly deviated from the resonance frequency $f_o$ of dielectric resonator 3 by the diode voltage $+V_v$. Electromagnetic couplings between transmission line 32 and dielectric resonator 3 and between the dielectric resonator 3 and open stub 21 are chosen so that the Q value of the oscillation circuit is kept high enough to stably maintain the oscillation frequency and at the same time the variable capacitance of diode $D_1$ can adequately change the oscillation frequency. A low-frequency noise current flowing into gate electrode G generates a low-frequency noise voltage $v_{nG}$, for example, 1 $\mu$V across a resistor $R_2$ typically of 1 k$\Omega$ connected between choke coil $Ch_2$ and gate bias voltage source $-V_G$. Low-frequency noise voltage $v_{nG}$ is input via capacitor $C_3$ and resistor $R_3$ to amplifier 41 having capacitor $C_4$ and resistor $R_4$ both in parallel to amplifier 41, where the gain can be adjusted by the value of resistor $R_4$ and capacitor $C_4$. The output of amplifier 41 is negatively fed back via capacitor $C_5$ and choke $Ch_1$ to diode $D_1$. Accordingly, the oscillation circuit, capacitor $C_3$, resistor $R_3$, amplifier 41, capacitor $C_5$ and variable capacitance diode $D_1$ constitute a negative feedback loop. Change in the oscillating frequency by the variable-capacitance diode is essentially equivalent to the change in the phase of the oscillating frequency. The adjustments of these feedback circuit elements are carried out so that the phase-noise component in the oscillated microwave signal becomes minimum. Power supply and ground circuit for amplifier 41 are omitted in the figures for simplification.

Figure 3:
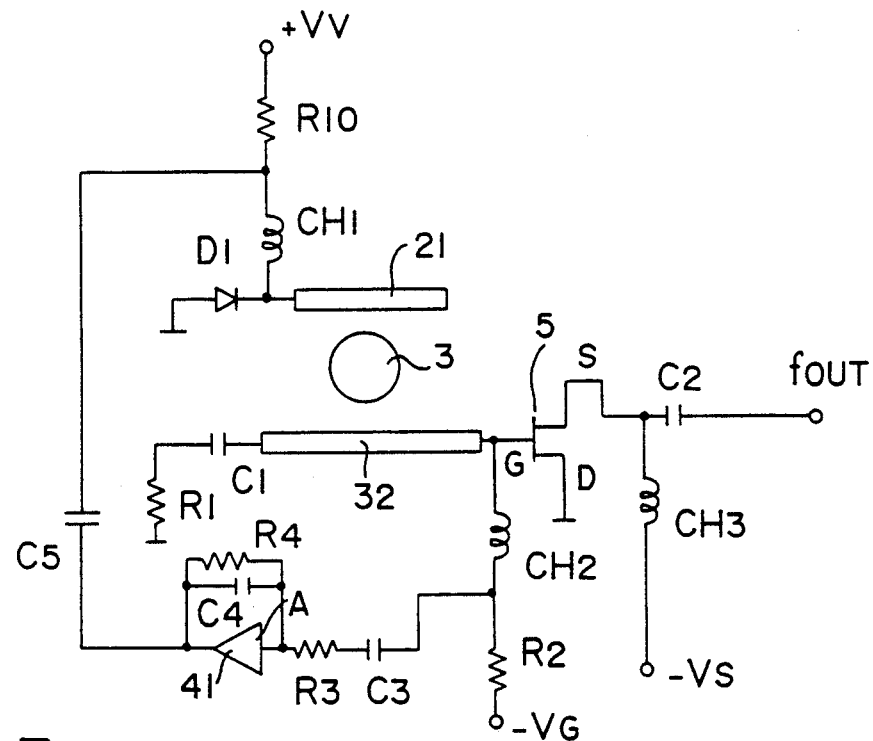
FIG. 3 shows a circuit configuration of a first preferred embodiment of the present invention.
Figure 4:
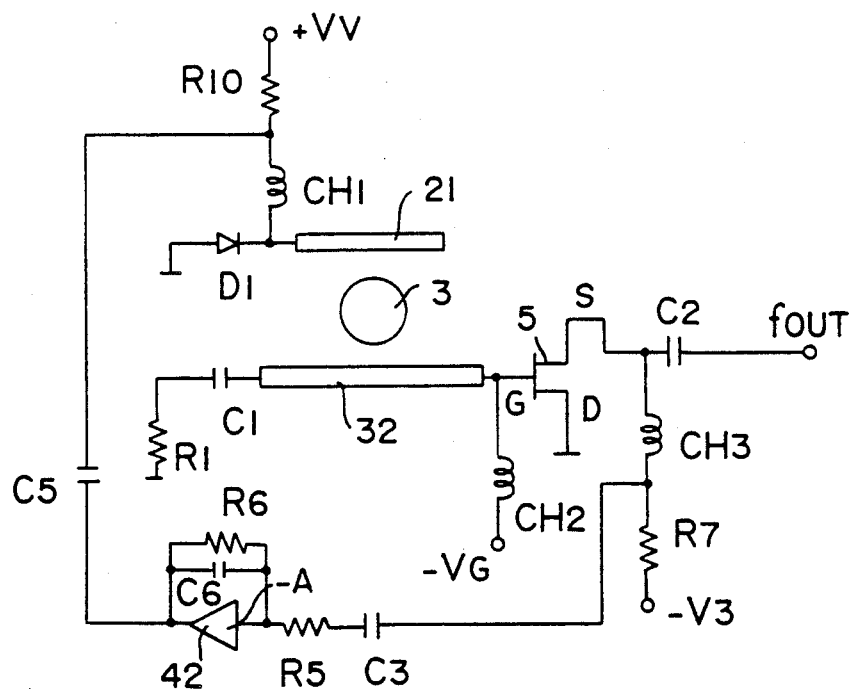
FIG. 4 shows a circuit configuration of a second preferred embodiment of the present invention.

A second preferred embodiment of the present invention is shown in FIG. 4, where resistor $R_2$ of FIG. 3 is replaced with resistor $R_7$ typically of 10 $\Omega$ connected between source voltage source $-V_3$ and choke coil $Ch_3$. A voltage generated across resistor $R_7$ is proportional to the drain current including the low-frequency current fluctuation. Thus detected low-frequency noise voltage $v_{nS}$ is fed back via capacitor $C_3$ and resistor $R_3$ to amplifier 42 having capacitor $C_6$ and resistor $R_6$ both in parallel to amplifier 42, where phase of the output signal is inverted, capacitor $C_5$ and choke $Ch_1$ to diode $D_1$. Function of the negative feedback loop is the same as that of FIG. 3 first preferred embodiment.

Figure 5:
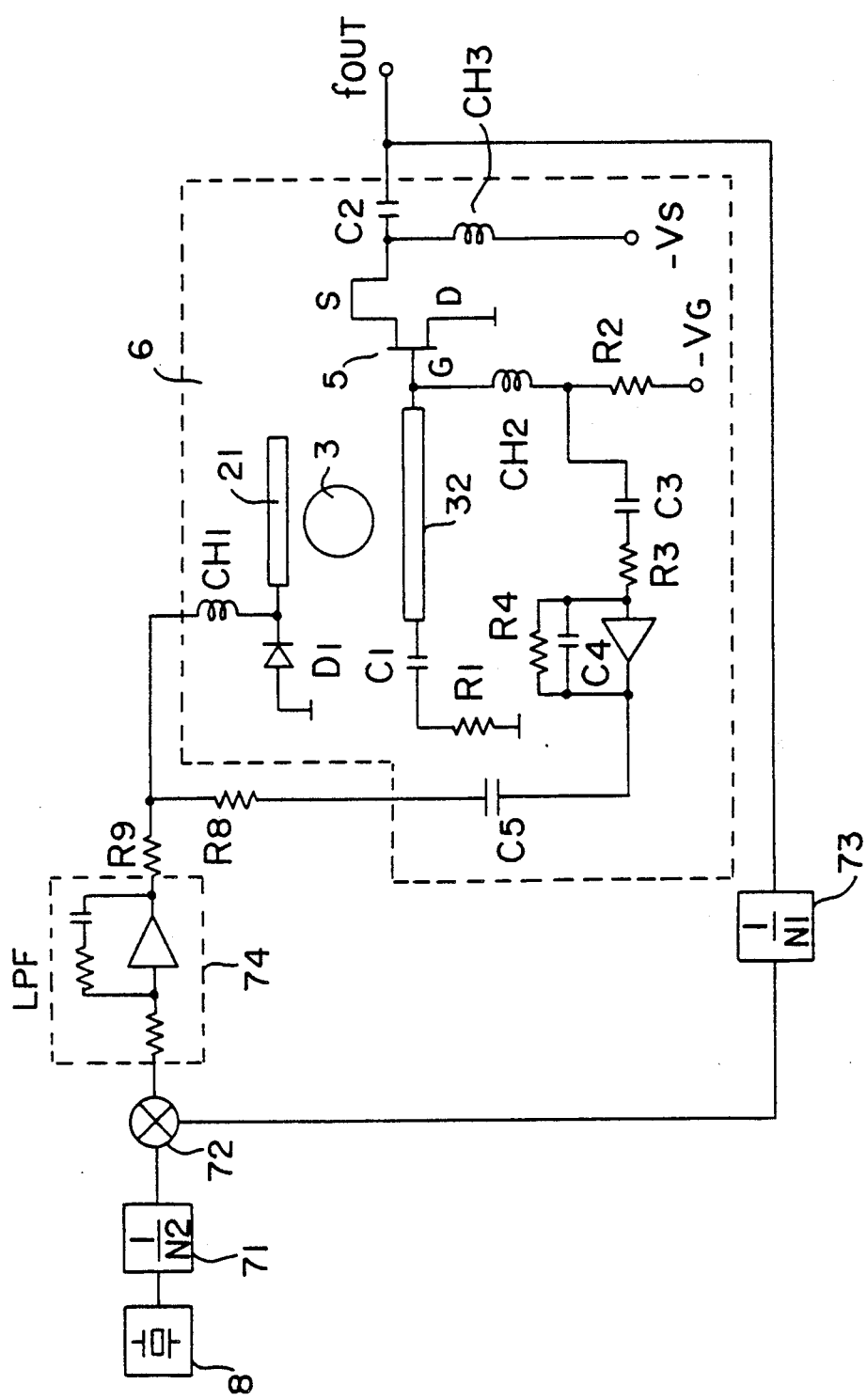
FIG. 5 shows a circuit configuration of a third preferred embodiment of the present invention.

A third preferred embodiment of the present invention is shown in FIG. 5, where the voltage-controlled oscillator 6 according to the first or second preferred embodiment is further phase-locked. Oscillator output $f_{out}$ of 6 GHz is divided by typically sixty thousands (i.e. $N_1 = 60,000$) by a frequency divider 73 to output 100 kHz. On the other hand, a crystal oscillator 8 generates a reference frequency typically of 10 MHz, which is then divided by 100 ($=N_2$) by a second frequency divider 71 so as to output a 100 kHz signal. Phases of these two 100 kHz signals from frequency-dividers 73 and 71 are compared in a phase comparator 72, output of which corresponds to the phase difference of the two 100 kHz signals input thereto. Output of phase comparator 72 is input to a low-pass filter 74 having a cut-off frequency typically of 1 kHz which is the loop band width of the phase-locked loop. Output of low-pass filter 74 is added via a resistor $R_9$ with the feedback signal supplied via resistor $R_8$ from capacitor $C_5$, so that the detected phase difference is negatively fed back to the diode $D_1$, accordingly, the phase difference is kept zero. Thus, the output frequency is phase-locked to the reference frequency of crystal oscillator 8, as well as noise-compensated for the low-frequency noise. The output frequency can also be changed by modifying the number of frequency division $N_1$ of the frequency divider 73.

In the above-described preferred embodiments the output frequency can be frequency-modulated, namely phase-modulated, by a base band signal superposed onto the voltage applied to diode $D_1$.

In the above-described preferred embodiments the low-frequency noise component existing within $\pm 1$ MHz of the oscillation frequency is reduced by 10 db to 20 db.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications are equivalents may be resorted to, falling within the scope of the invention.

What I claim is:

1. A voltage-controlled oscillator comprising:
  a transistor, a first terminal of said transistor being grounded, a second terminal of said transistor being connected to a resonator, a resonant frequency of said resonator being adjustable according to a voltage applied to a voltage-dependent reactance of said resonator, an output signal being output from a third terminal of said transistor;
  compensating means for detecting a low-frequency noise component generated in said transistor and feeding said detected low-frequency noise component to said voltage-dependent reactance so as to cancel a phase-noise component included in said output signal of the voltage-controlled oscillator.

2. A voltage-controlled oscillator as recited in claim 1, wherein said transistor is a gallium-arsenic field effect transistor.

3. A voltage-controlled oscillator as recited in claim 1, wherein said first terminal is a drain electrode, said second terminal is a gate electrode and said third terminal is a source electrode.

4. A voltage-controlled oscillator as recited in claim 1, wherein said voltage-dependent reactance is a variable-capacitance diode to which a reverse bias is applied, said variable-capacitance diode being electromagnetically coupled with said resonator.

5. A voltage-controlled oscillator as recited in claim 1, wherein said compensating means further comprises phase detecting means for detecting a phase difference between the phase of said output of said voltage-controlled oscillator and the phase of an output of a reference oscillator, said voltage fed back to said voltage-dependent reactance of said resonator being controlled so as to keep said detected phase difference essentially zero.

* * * * *